United States Patent
Freitag et al.

(10) Patent No.: US 9,349,391 B2
(45) Date of Patent: May 24, 2016

(54) CONTROLLING MAGNETIC LAYER ANISOTROPY FIELD BY OBLIQUE ANGLE STATIC DEPOSITION

(71) Applicant: HGST Netherlands B.V., Amsterdam (NL)

(72) Inventors: James M. Freitag, Sunnyvale, CA (US); Zheng Gao, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 28 days.

(21) Appl. No.: 14/097,192

(22) Filed: Dec. 4, 2013

(65) Prior Publication Data

US 2015/0154986 A1 Jun. 4, 2015

(51) Int. Cl.
*G11B 5/127* (2006.01)
*G01R 33/09* (2006.01)
*G11B 5/39* (2006.01)

(52) U.S. Cl.
CPC .............. *G11B 5/127* (2013.01); *G01R 33/093* (2013.01); *G01R 33/098* (2013.01); *G11B 5/1272* (2013.01); *G11B 5/3909* (2013.01); *G11B 5/3912* (2013.01); *G11B 5/1276* (2013.01); *G11B 2005/3996* (2013.01); *Y10T 428/11* (2015.01); *Y10T 428/115* (2015.01)

(58) Field of Classification Search
USPC ......................................................... 360/110
See application file for complete search history.

(56) References Cited

U.S. PATENT DOCUMENTS

| | | | |
|---|---|---|---|
| 4,868,698 A * | 9/1989 | Takahashi et al. | 360/125.5 |
| 5,838,521 A * | 11/1998 | Ravipati | 360/319 |
| 6,088,195 A * | 7/2000 | Kamiguchi et al. | 360/324.12 |
| 6,392,850 B1 * | 5/2002 | Tong et al. | 360/315 |
| 6,662,432 B2 | 12/2003 | Balamane et al. | |
| 6,724,581 B2 | 4/2004 | Westwood | |
| 6,818,961 B1 | 11/2004 | Rizzo et al. | |
| 7,061,731 B2 | 6/2006 | Larson et al. | |
| 7,483,295 B2 | 1/2009 | Guo et al. | |
| 7,531,882 B2 | 5/2009 | Nguyen et al. | |
| 7,602,591 B2 * | 10/2009 | Sbiaa et al. | 360/324.12 |
| 8,760,823 B1 * | 6/2014 | Chen et al. | 360/324.12 |
| 2006/0139818 A1 * | 6/2006 | Inaba et al. | 360/324.12 |
| 2006/0233017 A1 * | 10/2006 | Hosotani et al. | 365/158 |
| 2007/0133132 A1 * | 6/2007 | Carey et al. | 360/324.11 |
| 2011/0139606 A1 | 6/2011 | Tsunekawa et al. | |
| 2012/0015099 A1 * | 1/2012 | Sun et al. | 427/129 |
| 2013/0065085 A1 * | 3/2013 | Dimitrov et al. | 428/810 |
| 2013/0069642 A1 | 3/2013 | Sapozhnikov et al. | |
| 2013/0071692 A1 | 3/2013 | Covington et al. | |
| 2015/0064499 A1 * | 3/2015 | Schlage et al. | 428/811.3 |

OTHER PUBLICATIONS

Baril, L. et al., "Thermal relaxation of the free layer anisotropy in spin valves," Journal of Applied Physics, vol. 89, No. 2, Jan. 15, 2001, 1320-1324.

* cited by examiner

*Primary Examiner* — Carlos E Garcia
(74) *Attorney, Agent, or Firm* — Zilka-Kotab, PC

(57) ABSTRACT

In one general embodiment, a system includes a magnetic layer having first and second magnetic sublayers. An anisotropy of the first magnetic sublayer is oriented in a different direction than an anisotropy of the second magnetic sublayer. In another general embodiment, a magnetic head includes a magnetic layer having first and second magnetic sublayers directly adjacent one another. A deposition thickness of the magnetic layer is less than 60 angstroms. An interface between the magnetic sublayers is oriented at an angle of greater than 2 degrees and less than 88 degrees relative to a plane of deposition thereof. The magnetic layer includes at least one material selected from a group consisting of Co, Fe, Ni, CoFe, CoFeB, CoHf and NiFe.

23 Claims, 13 Drawing Sheets

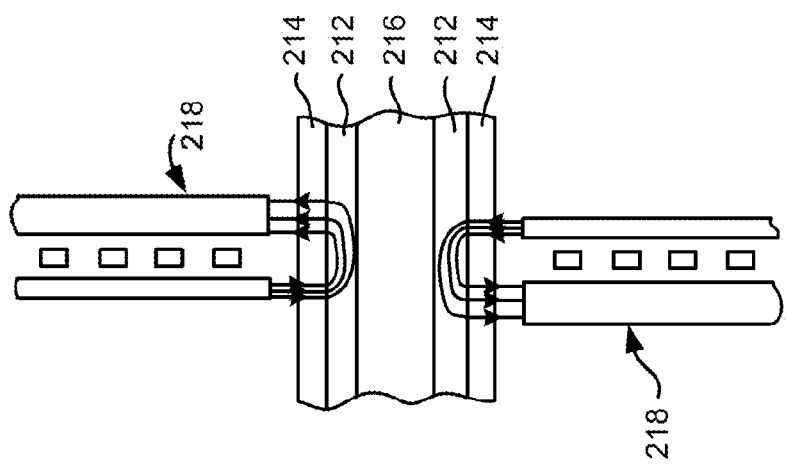
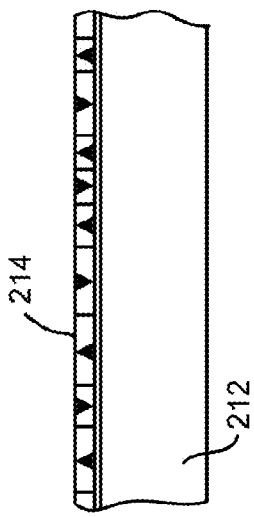
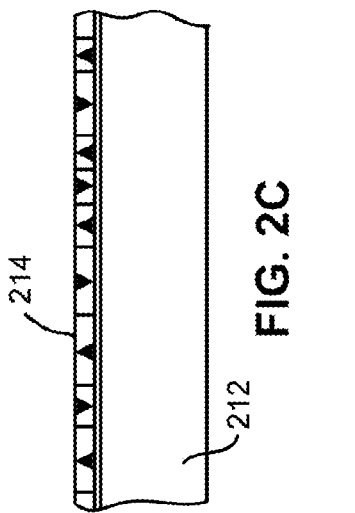
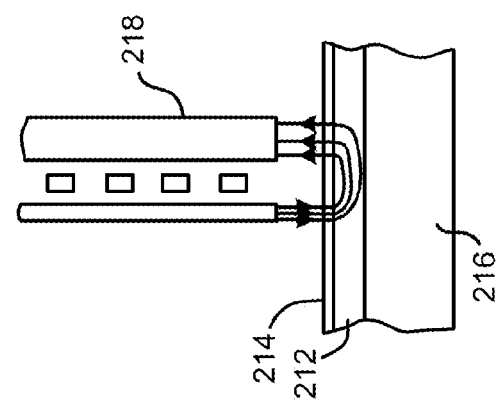
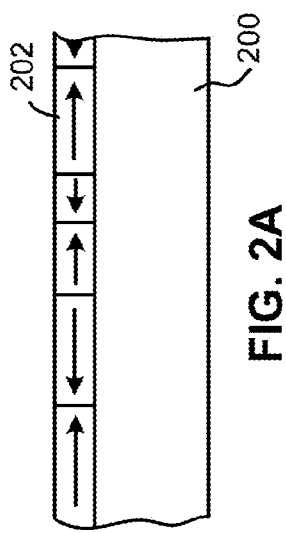
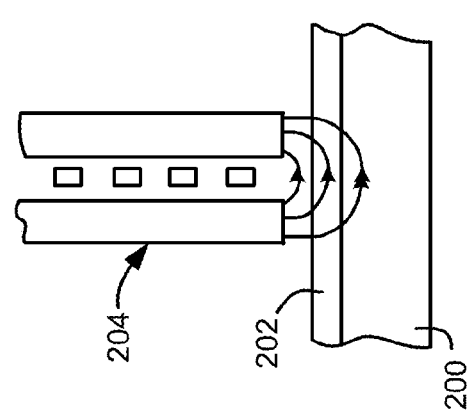

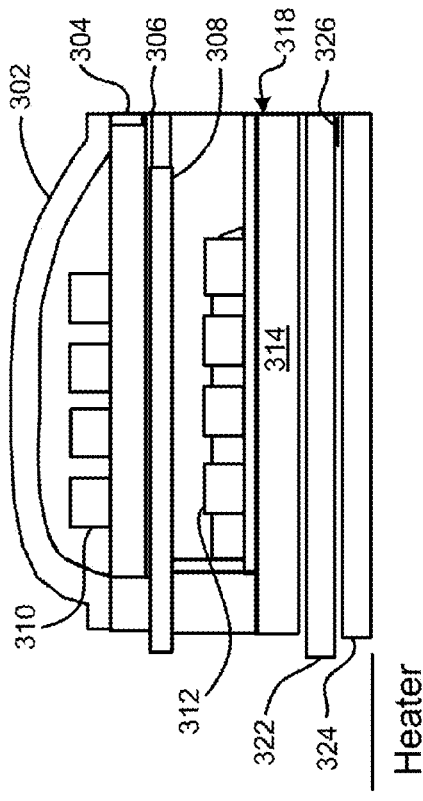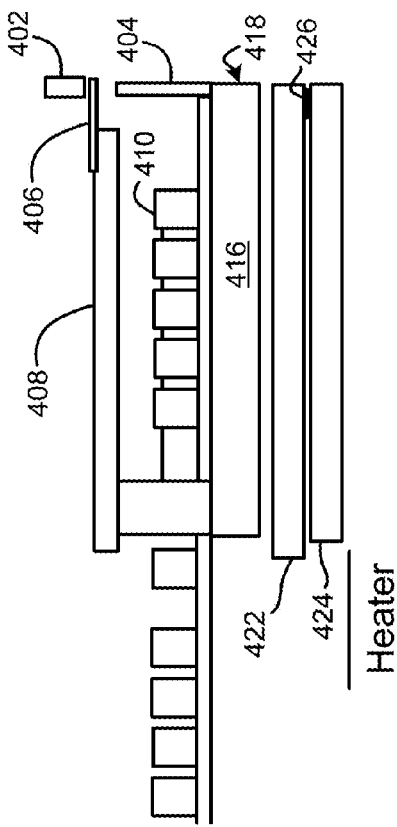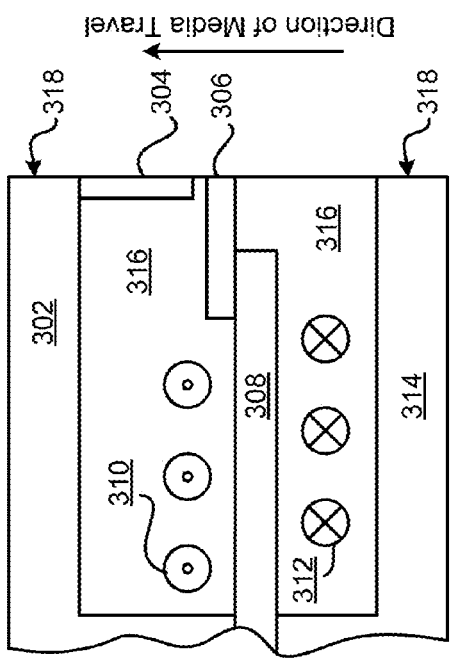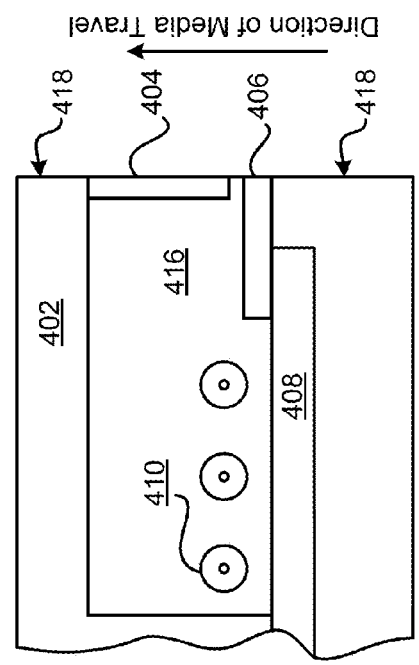

CONTROLLING MAGNETIC LAYER ANISOTROPY FIELD BY OBLIQUE ANGLE STATIC DEPOSITION

FIELD OF THE INVENTION

The present invention relates to data storage systems, and more particularly, this invention relates to forming magnetic layers and/or magnetic sublayers using static deposition to control the anisotropy magnitude and orientation thereof.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

Anisotropy field (Hk) is a fundamental magnetic parameter of ferromagnetic materials. Moreover, optimizing the Hk value of various layers of read and/or write portions of magnetic heads is an important factor in improving performance thereof. In conventional products, the Hk values of the different layers thereof are changed by altering the magnetic materials of the layers themselves. However, by altering the magnetic materials of the layers, other properties of the layers are negatively affected.

It is therefore highly desirable to develop a method to control the Hk value of various layers of magnetic heads, independent of their composition. This is particularly true for free layers of a sensor, which are much thinner than most magnetic layers in an exemplary magnetic head. Thus, in sharp contrast to conventional products, various embodiments described herein preferably incorporate static oblique angle deposition, thereby improving the tunability of the anisotropy for magnetic layers, preferably resulting in improved magnetic stabilization for magnetic layers according to various embodiments.

SUMMARY

A system according to one embodiment includes a magnetic layer having first and second magnetic sublayers. An anisotropy of the first magnetic sublayer is oriented in a different direction than an anisotropy of the second magnetic sublayer.

A magnetic head according to another embodiment includes a magnetic layer having first and second magnetic sublayers directly adjacent one another. A deposition thickness of the magnetic layer is less than 60 angstroms. An interface between the magnetic sublayers is oriented at an angle of greater than 2 degrees and less than 88 degrees relative to a plane of deposition thereof. The magnetic layer includes at least one material selected from a group consisting of Co, Fe, Ni, CoFe, CoFeB, CoHf and NiFe.

A method according to one embodiment includes depositing a first magnetic layer onto a surface from a first direction oriented at an oblique deposition angle from normal to the surface; and depositing a second magnetic layer over the first magnetic layer from a second direction oriented at a second oblique deposition angle from the normal to the surface. The surface does not rotate during the depositing.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

DETAILED DESCRIPTION

Figure 1:
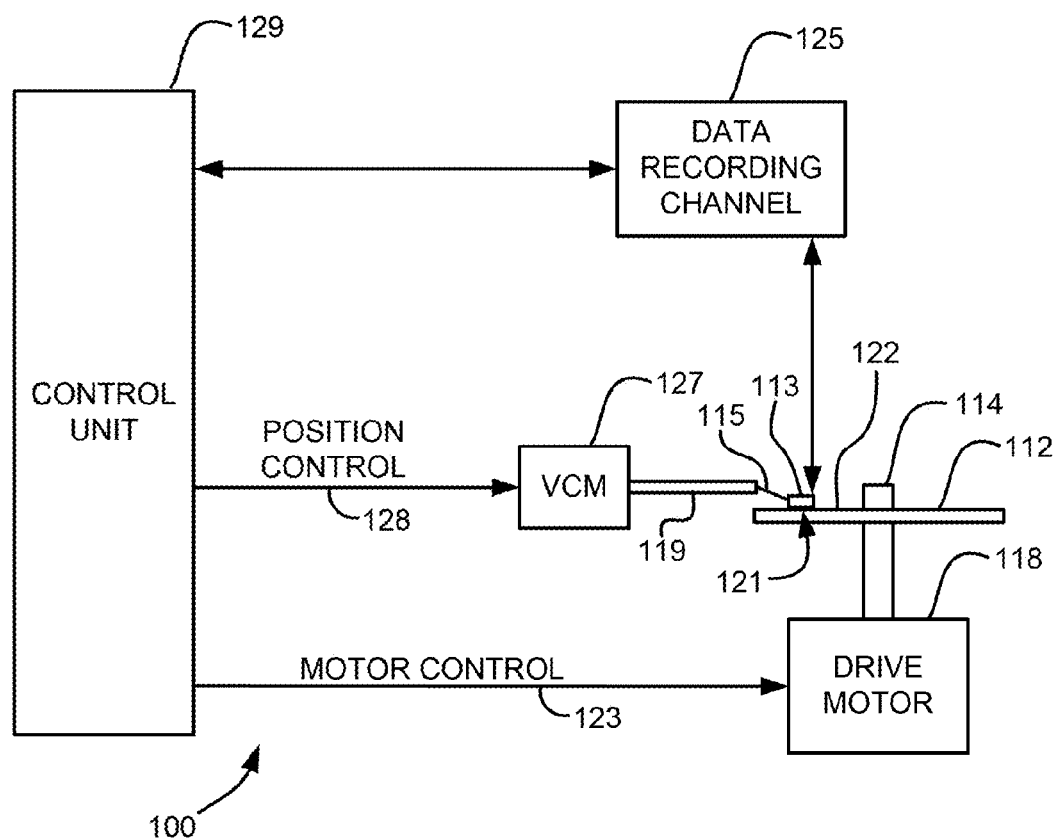
FIG. 1 is a simplified drawing of a magnetic recording disk drive system.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems, as well as operation and/or component parts thereof, and methods of forming magnetic layers and/or magnetic sublayers using static deposition to control the anisotropy magnitude and orientation thereof. Therefore, by selecting which layers are formed using static deposition, and by choosing the angle(s) and orientation(s) at which a deposition is conducted, the magnitude and/or orientation of the anisotropy for the resulting magnetic layer may be tuned as desired, which will be described in further detail below.

Additionally, for devices that use spin torque magnetization switching, the critical current for magnetic switching depends on the Hk of the magnetic element. Thus, various embodiments herein may develop the ability to control the Hk values and other magnetic properties of ferromagnetic layers in magnetic devices, preferably in addition to eliminating device to device variations, as will be discussed in detail below.

In one general embodiment, a system includes a magnetic layer having first and second magnetic sublayers. An anisotropy of the first magnetic sublayer is oriented in a different direction than an anisotropy of the second magnetic sublayer.

In another general embodiment, a magnetic head includes a magnetic layer having first and second magnetic sublayers directly adjacent one another. A deposition thickness of the magnetic layer is less than 60 angstroms. An interface between the magnetic sublayers is oriented at an angle of greater than 2 degrees and less than 88 degrees relative to a plane of deposition thereof. The magnetic layer includes at least one material selected from a group consisting of Co, Fe, Ni, CoFe, CoFeB, CoHf and NiFe.

In yet another general embodiment, a method includes depositing a first magnetic layer onto a surface from a first direction oriented at an oblique deposition angle from normal to the surface; and depositing a second magnetic layer over the first magnetic layer from a second direction oriented at a second oblique deposition angle from the normal to the surface. The surface does not rotate during the depositing.

Referring now to FIG. 1, there is shown a disk drive 100 in accordance with one embodiment of the present invention. As shown in FIG. 1, at least one rotatable magnetic medium (e.g., magnetic disk) 112 is supported on a spindle 114 and rotated by a drive mechanism, which may include a disk drive motor 118. The magnetic recording on each disk is typically in the form of an annular pattern of concentric data tracks (not shown) on the disk 112. Thus, the disk drive motor 118 preferably passes the magnetic disk 112 over the magnetic read/write portions 121, described immediately below.

At least one slider 113 is positioned near the disk 112, each slider 113 supporting one or more magnetic read/write portions 121, e.g., of a magnetic head according to any of the approaches described and/or suggested herein. As the disk rotates, slider 113 is moved radially in and out over disk surface 122 so that portions 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. In a preferred approach, the control unit 129 is electrically coupled (e.g., via wire, cable, line, etc.) to the one or more magnetic read/write portions 121, for controlling operation thereof. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write portions 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write portion includes a coil layer embedded in one or more insulation layers (insulation stack), the insulation stack being located between first and second pole piece layers. A gap is formed between the first and second pole piece layers by a gap layer at an air bearing surface (ABS) of the write portion. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Except as otherwise described herein, the various components of the structures of FIGS. 3A-4B may be of conventional materials and design, as would be understood by one skilled in the art.

Figure 5:
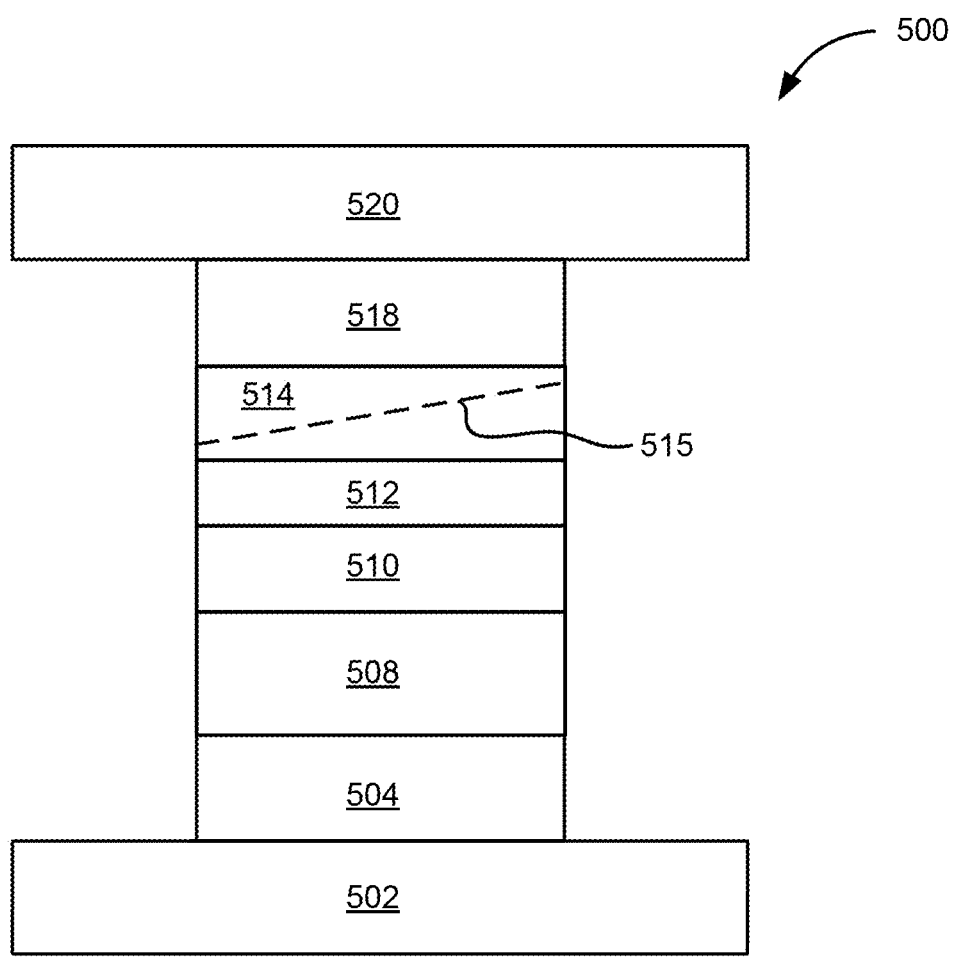
FIG. 5 is a partial cross-sectional view of a magnetic head according to one embodiment.

FIG. 5 depicts a sensor portion of a magnetic head 500, in accordance with one embodiment. As an option, the present magnetic head 500 may be implemented in conjunction with features from any other embodiment listed herein, such as those described with reference to the other FIGS. Of course, however, such magnetic head 500 and others presented herein may be used in various applications and/or in permutations which may or may not be specifically described in the illustrative embodiments listed herein. Further, the magnetic head 500 presented herein may be used in any desired environment.

Referring now to FIG. 5, the magnetic head 500 includes a lower shield 502 and an underlayer 504, e.g., stack of seed layers, above the lower shield 502. Additionally, the magnetic head 500 includes an antiferromagnetic (AFM) layer 508, a reference layer or synthetic ferrimagnetic pinned layer 510, a spacer and/or tunnel barrier layer 512, and a free layer 514. The free layer 514 may have a tuned Hk magnitude and/or orientation. The free layer 514 may be composed of a single layer or a multitude of sublayers, each fabricated according to a process such as that described with reference to FIG. 6, with an interface 515 between separately formed sublayers of the free layer 514. A cap layer 518 may also be included above the free layer 514. Moreover, an upper shield 520 may additionally be positioned above the cap layer 518, as illustrated in FIG. 5. Said layers may be of conventional construction, except as otherwise provided herein.

As mentioned above, various embodiments herein may be used to control the Hk magnitude and/or orientation of one or more of the magnetic layers of a magnetic head (e.g., 500 of FIG. 5), preferably independent of the material composition of said layers. Thus, according to preferred approaches, the anisotropy orientation and/or magnitude of a given layer may be tuned independently of the other properties of said layer. This is particularly desirable for a free layer 514, but may be applicable to any of the magnetic layers that are included in any of the approaches herein, such as the reference or pinned layer 510, shields 502, 520, etc. as well as other industrial applications.

Figure 6:
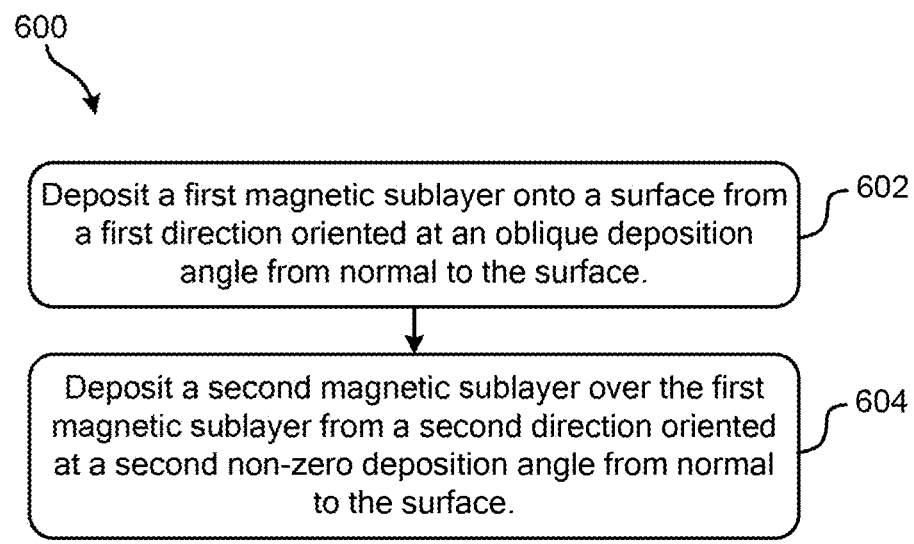
FIG. 6 shows the process steps of a method, according to one embodiment.

Although various embodiments are described and/or suggested herein, a method 600 illustrated in FIG. 6 may be used to form a magnetic layer, such as a free layer, reference layer, etc. of a magnetic head, using any conventional magnetic material. Illustrative materials for magnetic sublayers of such magnetic layer may include one or more of Co, Fe, Ni, CoFe, CoFeB, CoHf and NiFe, etc.

FIG. 6 illustrates process steps according to a preferred method 600 of forming a layer using static deposition. As an option, the present method 600 may be implemented in conjunction with features from any other embodiment listed herein, such as those described with reference to the other FIGS. Of course, however, such method 600 and others presented herein may be used in various applications and/or in permutations which may or may not be specifically described in the illustrative embodiments listed herein. Further, the method 600 presented herein may be used in any desired environment.

Referring now to FIG. 6, the method 600 includes depositing a first magnetic sublayer onto a surface from a first direction oriented at an oblique deposition angle from normal to the surface. See operation 602. Moreover, operation 604 of method 600 includes depositing a second magnetic sublayer over the first magnetic sublayer from a second direction oriented at a second oblique deposition angle from normal to the surface.

According to various approaches, depositing the first and/or second magnetic sublayers may incorporate physical vapor deposition, sputtering, chemical vapor deposition, etc., or any other directional deposition methods which would be apparent to one skilled in the art upon reading the present description. Furthermore, any of the deposition processes according to any of the embodiments described and/or suggested herein may incorporate any of the aforementioned methods and/or combinations thereof.

It should also be noted that, with reference to the present operations 602, 604, "surface" may include any surface on which it may be desirable to form a magnetic layer thereon. Illustrative surfaces may include a substrate, a testing platform, a seed layer, a barrier layer (e.g., see 512 of FIG. 5), etc. Additionally, although the method 600 only includes depositing two layers, in further approaches, additional magnetic sublayers may be deposited, e.g., above the first and second magnetic sublayers, in a similar and/or the same fashion as described above with reference to the operations 602, 604.

Both operations 602, 604 of method 600 are preferably performed such that the surface does not rotate during the depositing of the first and/or second magnetic layers and such that the projection of the deposition of the flux onto the substrate is fixed thus determining the direction of induced anisotropy, which may be different than the direction of the deposition flux. By preventing rotational movement of the surface during each of the respective deposition steps, the static deposition of the magnetic layers allows for a significant improvement in the Bk of the resulting magnetic layer formed using a method similar to or the same as that illustrated in FIG. 6.

According to one approach, the first and second magnetic sublayers may be formed without breaking vacuum. Thus, the magnetic sublayers may be in direct contact with each other, e.g., one formed directly atop the other. Preferably, the second magnetic sublayer deposited in step 604 is performed with the substrate rotation angle chosen such that the projection of the deposition flux onto the substrate is in the opposite direction of the first magnetic sublayer. Under these conditions, the induced anisotropy of the second sublayer adds to the anisotropy induced during deposition of the first sublayer whereas any thickness non-uniformity arising due to varying distance from deposition source to substrate during deposition of the first sublayer is compensated by deposition of the second sublayer from the opposite direction.

Furthermore, the first and second oblique deposition angles may be the same or different, depending on the desired embodiment. It follows that, by depositing the first and second magnetic sublayers in two potentially different oblique deposition angles, and/or at two potentially different directions, the interface between the magnetic sublayers may form at an angle relative to a horizontal plane (e.g., see interface 515 of FIG. 5). In approaches where a horizontal upper surface is desired, the directions of static deposition may be directly opposed and oriented at positive and negative angles relative to a vertical axis, and about the same deposition time may be used in both steps.

This angled interface may result from the deposited material more quickly accumulating closer to the target of the deposition step, thereby producing the larger deposition thickness on the side of the layer towards the target, while the deposition thickness tapers moving away from the target towards a thinner side of the layer opposite thereof. Thus, the first oblique deposition angle may be selected to control the orientation of the interface between the magnetic sublayers. According to preferred approaches, the interface may be positioned at an angle of greater than about 2 degrees and less than about 88 degrees relative to a horizontal plane of deposition, but could be higher or lower.

As mentioned above, the directions (as opposed to angle) at which the deposition steps are performed may also be selected to affect the properties of the layers being formed. For example, assume that the deposition device is fixed, except possibly for the ability to change the angle of deposition. The first magnetic sublayer may be deposited with the wafer oriented at nominal angle 0. The second direction of deposition can be selected by rotating the wafer clockwise and/or counterclockwise in its plane up to 180 degrees from the nominal angle.

It follows that, by using static deposition to form a given magnetic layer, the orientation of the resulting layer's anisotropy may be defined by the directions and deposition angles at which the depositions are performed.

Moreover, the inventors discovered that the magnitude and orientation of the anisotropy field induced by static oblique angle deposition strongly depends on additional factors, including, but not limited to deposition thicknesses, material characteristics, etc. Further, such behaviors are not uniform from one material to another. For example, as discussed in more detail below with reference to FIGS. 10A-10B, the anisotropy field of CoFe as-deposited increases with increased deposition thickness, while the anisotropy field of CoFeB as-deposited exhibits the opposite behavior, decreasing with increased deposition thickness. Upon annealing, the anisotropy field of CoFeB does not change much, but the anisotropy field of CoFe changes dramatically, with the thinner CoFeB exhibiting a higher anisotropy field than CoFe.

Thus, it is impossible in most cases to predict the anisotropy characteristics of a given material until some experimentation or modeling is performed. However, one skilled in the art, armed with the teachings herein, would be able to reproduce the various embodiments, including the embodiments having a stack of sublayers with a tuned net anisotropy, as discussed herein.

As mentioned above, magnetic sublayers may have different anisotropy orientations and/or magnitudes. Moreover, it follows that a magnetic layer, formed by two or more magnetic sublayers, may then have a net anisotropy orientation that is tuned by the anisotropy orientations and magnitudes of the two or more magnetic sublayers.

Looking to FIG. 7, the figure illustrates a representational view of a thin film system 700 having a magnetic layer in accordance with various exemplary embodiments, which were used to generate experimental results as described below. As an option, the present system 700 may be implemented in conjunction with features from any other embodiment listed herein, such as those described with reference to the other FIGS. Of course, however, such system 700 and others presented herein may be used in various applications and/or in permutations which may or may not be specifically described in the illustrative embodiments listed herein. Further, the system 700 presented herein may be used in any desired environment.

The system 700 includes seed layers 701, 702 and a barrier layer 704 positioned below a magnetic layer 706. Additionally, according to the present illustrative embodiment, a layered structure 714 is depicted as being positioned above the magnetic layer 706.

Although the seed layers 701, 702 are shown as a single layer, in other approaches, the seed layers 701, 702 may include one or more sublayers. Additionally, the upper layered structure 714 may include any number of desired sublayers, e.g., acting as a cap (e.g., see 518 of FIG. 5), a seed layer for additional layers above, etc., depending on the desired embodiment.

Illustrative materials for the seed layers 701, 702 and/or upper layered structure 714 may include Ru, Ta, etc., depending on the desired embodiment. According to one approach, the upper layered structure 714 may have three layers made of Ru, Ta, and Ru respectively. Furthermore, according to another illustrative approach, which is in no way intended to limit the invention, the barrier layer 704 may include MgO.

Figure 7:
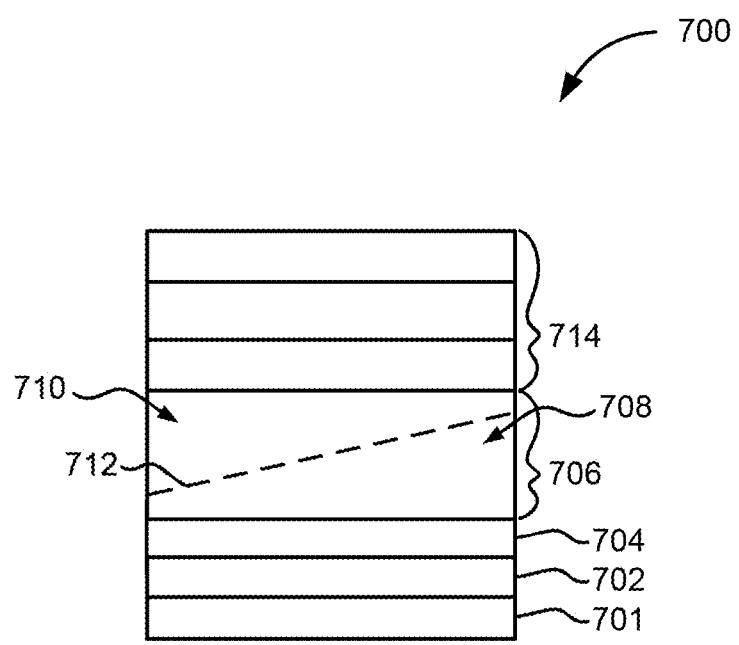
FIG. 7 is a partial cross-sectional view of a magnetic head according to one embodiment.

With continued reference to FIG. 7, the magnetic layer 706 has first and second magnetic sublayers 708, 710 respectively. In other embodiments, the magnetic layer 706 may include additional sublayers (e.g., more than two sublayers), but is not limited thereto. Each of the sublayers 708, 710 of the magnetic layer 706 is preferably deposited in a static, oblique fashion, e.g., in an effort to control the anisotropy of the sublayers 708, 710 and/or the magnetic layer 706 as a whole, as will be discussed in detail below.

According to some approaches, the magnetic layer 706 may include any of the magnetic layers described above with reference to the magnetic head 500 of FIG. 5. Thus, depending on the desired embodiment, the magnetic layer 706 may be a free layer (e.g., see 514 of FIG. 5), a pinned layer, a soft bias layer, a shield layer (e.g., see 502, 520 of FIG. 5), etc. However, for experimentation conducted by the inventors, a free layer (e.g., see 514 of FIG. 5) was used as the magnetic layer 706 of a representational thin film system as illustrated in FIG. 7. As described below, the physical composition of the respective layers used for experimentation included specific materials and dimensions, which are in no way intended to limit the invention. According to other approaches, any of the layers of the representational thin film system 700 of FIG. 7 may incorporate any of the approaches described and/or suggested herein, depending on the desired embodiment.

With continued reference to FIG. 7, the system 700 may further include a second magnetic layer, e.g., spaced from the magnetic layer 706. Depending on the desired embodiment, the second magnetic layer may include any of the approaches described herein with reference to the magnetic layer 706. Thus, in one approach, second magnetic layer may have at least a third and fourth magnetic sublayers, but may include additional magnetic sublayers, depending on the desired embodiment. In such approaches having a second magnetic layer with a third and fourth magnetic sublayers, the anisotropy of the third magnetic sublayer, as deposited, may be oriented in a different direction than an anisotropy of the fourth magnetic sublayer, as deposited.

With continued reference to FIG. 7, illustrative materials for the magnetic layer 706 may include one or more of Co, Fe, Ni, CoFe, CoFeB, CoHf, NiFe, etc. According to some approaches, the first and second sublayers 708, 710 may include the same and/or similar materials. However, in preferred approaches, the sublayers 708, 710 may have different materials, e.g., so as to selectively tune properties of the magnetic layer 706, as will soon become apparent.

According to preferred embodiments, the deposition thickness of the magnetic layer 706 may be less than about 60 angstroms (Å) and greater than 5 Å, but may be higher or lower in other approaches. Thus, the deposition thicknesses of each of the first and second sublayers 708, 710 may add up to result in a deposition thickness of the magnetic layer 706 that is less than about 60 Å. However, according to different embodiments, the deposition thicknesses of the first and second sublayers 708, 710 may be the same or different.

According to an exemplary embodiment, which is in no way intended to limit the invention, the magnetic layer 706 may be a free layer, in which case it would be preferable that the deposition thickness of the free layer be less than about 60 Å. Illustrative methods of forming a magnetic layer are described in detail above (e.g., see FIG. 6), and may be implemented with any of the magnetic layers introduced and/or suggested herein. It should be noted that, as used herein, the term "about" with reference to some stated value refers to the stated value ±10% of said value.

With continued reference to FIG. 7, although the boundary between the first and second magnetic sublayers 708, 710 is represented by a dashed line 712, the transition between the first and second magnetic sublayers 708, 710 may not be readily apparent. In some approaches, the location of the transition between the first and second magnetic sublayers 708, 710 may be determined by observing the strain of the crystalline structure, e.g., by x-ray diffraction, of each of the layers, which result from oblique angle deposition of sublayers 708, 710 without breaking vacuum. Thus, according to a preferred approach, the two magnetic sublayers 708, 710 may be in direct contact with each other, e.g., one formed directly atop the other.

Although each of the magnetic sublayers may have unique strains, the magnetic layer (e.g., as a whole) preferably has a higher strain along a first axis than along a second axis oriented perpendicular to the first axis and in a same plane therewith, as will soon become apparent.

Through experimentation, the inventors found that using static deposition techniques may enable tuning of the anisotropy orientation and/or magnitude for different magnetic layers. According to an exemplary approach, which is in no way intended to limit the invention, the anisotropy of the first magnetic sublayer 708, as deposited, may be oriented in a different direction than the anisotropy of the second magnetic sublayer 710, as deposited. Additionally, the magnitude of the anisotropy of the first magnetic sublayer 708 may be different than a magnitude of the anisotropy of the second magnetic sublayer 710. By incorporating magnetic sublayers having different anisotropy orientations and/or magnitudes, it follows that the resulting magnetic layer may then have a net anisotropy orientation and/or magnitude that is tuned by selection of the anisotropy orientations and magnitudes of the sublayers.

Experimental

According to various experimental embodiments, which are in no way intended to limit the invention, the inventors tested a magnetic sensor stack having the configuration of the system 700 illustrated in FIG. 7. The sensor stack included a dual layered seed layer (e.g., see 701, 702 of FIG. 7) which included a Ta layer having a deposition thickness of about 30 Å, above which was a Ru layer having a deposition thickness of about 20 Å. An MgO barrier layer (e.g., see 704 of FIG. 7) with a thickness of about 10 Å, was positioned above the dual layered seed layer. Furthermore, a magnetic layer (e.g., see 706 of FIG. 7) and upper layered structure (e.g., see 714 of FIG. 7) were positioned above the MgO barrier layer. The material composition of the magnetic layer varied depending on the experiment conducted, which is represented in the x-axis of the graphs illustrated in FIGS. 8A-9C. However, the deposition thickness of the magnetic layer remained at about 40 Å, regardless of the material used. Moreover, the layered structure (e.g., see 714 of FIG. 7) included three layers of Ru, Ta and Ru having thicknesses of about 15 Å, 15 Å, and 50 Å respectively.

Moreover, it should be noted that, in the graphs depicted in FIGS. 8A-9C, "Full stack" represents an illustrative structure 700 used for experimentation, having a magnetic layer 706 constructed as follows: CoFe with a deposition thickness of about 4.5 Å, above which was a CoFeB layer with a deposition thickness of about 16 Å, a CoHf layer with a deposition thickness of about 11 Å, and an uppermost layer of NiFe having a deposition thickness of about 36.5 Å.

Looking to Table 1, the data gathered from the tests conducted on the aforementioned magnetic sensor stack is presented.

TABLE 1

| Annealed? | Deposition | Strain Axis $S_y$ (%) | Axis $\Box S_y$ (%) | Along X CoFe (110) FWHM (degrees) | Perp. to X CoFe (110) FWHM (degrees) |
|---|---|---|---|---|---|
| Yes | Static | 0.058 | 0.009 | 1.54 (+−0.025) | 1.39 (+−0.007) |
| No | Static | 0.015 | 0.021 | 1.68 (+−0.043) | 1.63 (+−0.025) |
| Yes | Rotated | 0.026 | 0.003 | 1.39 (+−0.008) | 1.34 (+−0.009) |
| No | Rotated | 0.009 | 0.003 | 1.64 (+−0.005) | 1.60 (+−0.031) |

Table 1 presents data taken from testing conducted on different approaches of the CoFe magnetic layer. The "Annealed" column indicates whether the magnetic layer was formed by incorporating an annealing process step or not, while the "Deposition" column outlines whether the magnetic layer was formed using static deposition or rotational deposition.

Looking to the data shown in Table 1, it is apparent that, by forming the magnetic layers using static deposition rather than rotational deposition, the non-annealed layers experienced an increase in strain from 0.009 to 0.015, while the annealed layers experienced an increase in strain from 0.026 to 0.058. The inventors have found that this increase in axial dependent strain has a significant effect on the anisotropy of the magnetic layer.

Figure 8A:
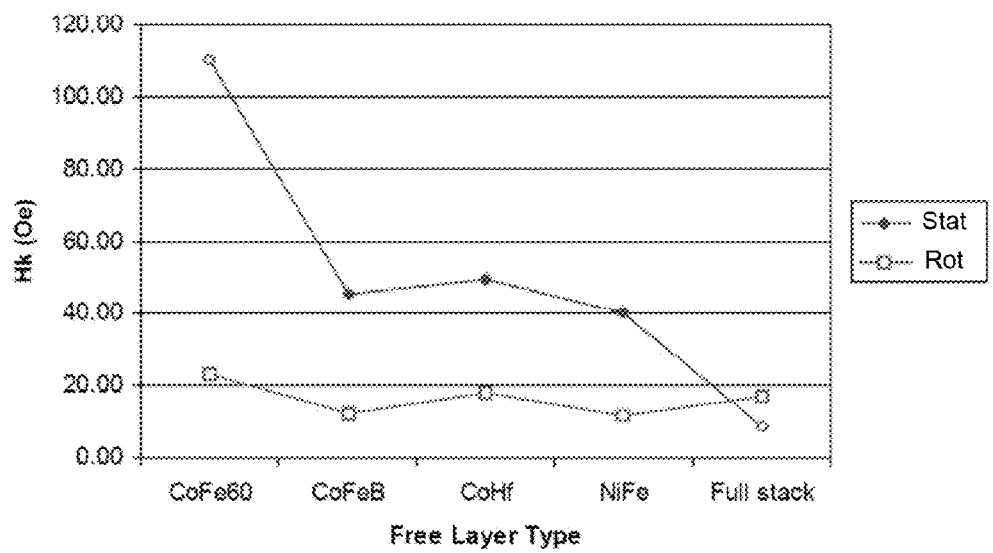
FIGS. 8A-8C are graphs illustrating comparative Hk and coercivity values of several materials formed by conventional and inventive methods.
Figure 8B:
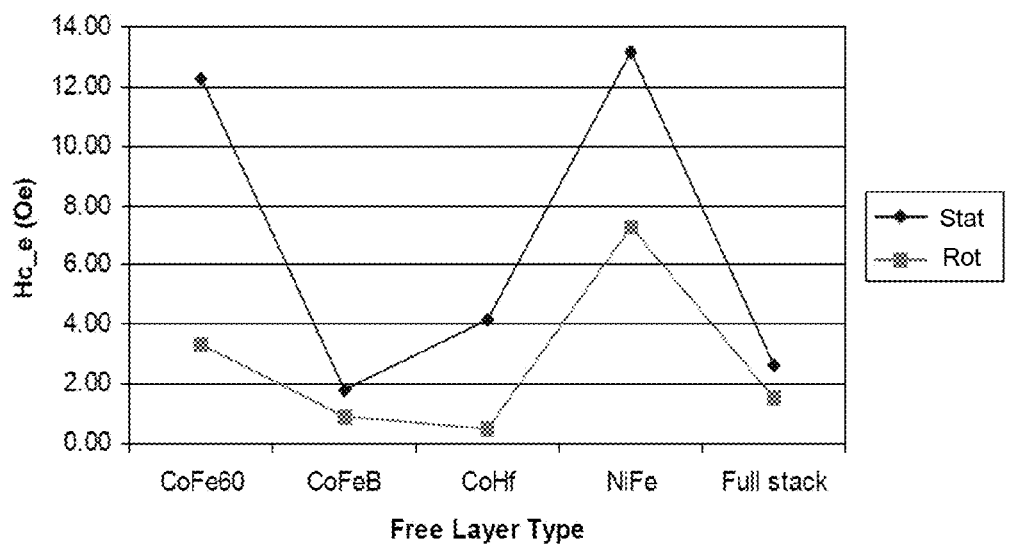
Figure 8C:
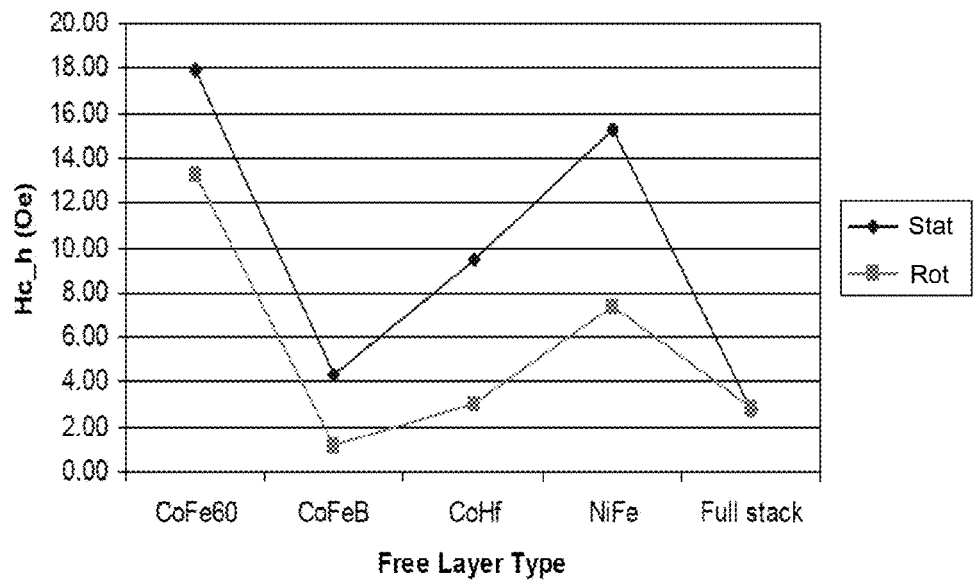

FIGS. 8A-8C include graphs 800, 810, 820 respectively, comparing the Hk values corresponding to testing conducted on free layers made of different materials, and using different deposition methods. As described above, testing was conducted on an illustrative thin film system, e.g., as shown in FIG. 7.

The free layers formed using static deposition Stat were not rotated (e.g., were kept rotationally stationary) during formation thereof, while the free layers formed using rotated deposition Rot implemented conventional deposition methods in which the substrate was rotated during the formation thereof.

Looking to FIG. 8A, the data presented in graph 800 illustrates that free layers formed using static deposition Stat are capable of achieving much higher Hk values than free layers formed using rotated deposition Rot. It should be noted that the drop to the Hk value of the static deposition Stat sample for the Full stack can be attributed to the anisotropy orientations and/or magnitudes of different sublayers within the Full stack affecting each other, e.g., due to their differing orientations and/or magnitudes, as mentioned above.

With continued reference to FIG. 8A, the symbols (points) on the curves of the graph 800 also denote the orientation of the anisotropy for the given structure. The open symbols indicate instances in which the anisotropy is orientation in a direction perpendicular to the wafer alignment notch. Solid symbols indicate instances for which the orientation of the anisotropy is parallel to the wafer alignment notch.

While the anisotropy of the layers formed using rotated deposition Rot was oriented consistently perpendicular to the wafer alignment notch, the orientation of the anisotropy for layers formed using static deposition Stat varied between being parallel and perpendicular to the wafer alignment notch, depending on the materials used. Thus, in addition to illustrating the improvements the Hk value, FIG. 8A shows that layers formed using static deposition enable selection of differing anisotropy orientations than conventionally achievable.

Similarly, FIGS. 8B-8C illustrate the easy and hard axis coercivities Hc_e, Hc_h of layers formed using static deposition Stat are capable of achieving much higher Hk values than free layers formed using rotated deposition Rot. Again, improvements are noted for the anisotropy field of layers formed using static deposition Stat over those layers formed by implementing conventionally practiced, rotated deposition Rot.

Figure 9A:
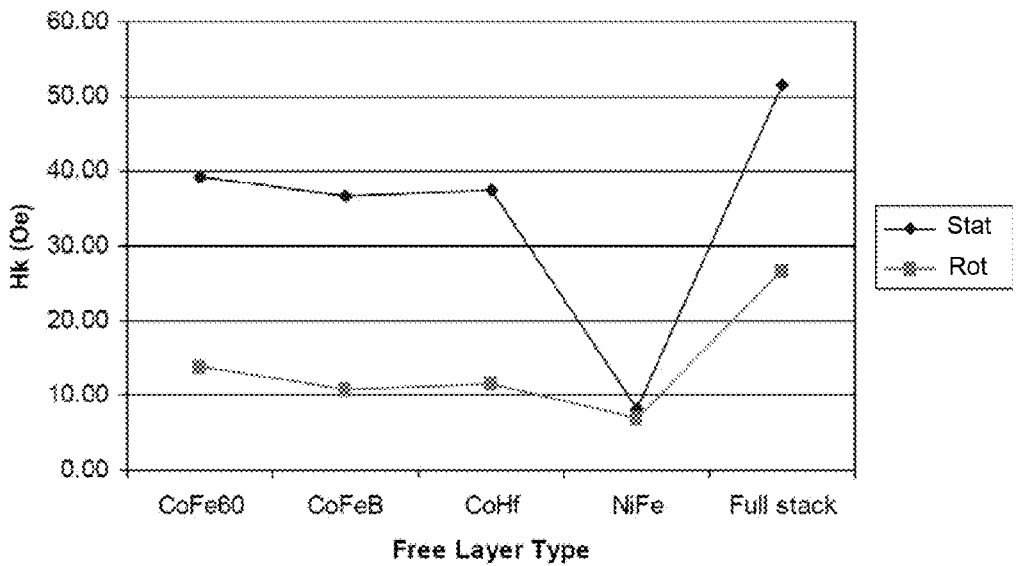
FIGS. 9A-9C are graphs illustrating comparative Hk and coercivity values of several materials formed by conventional and inventive methods after annealing.
Figure 9B:
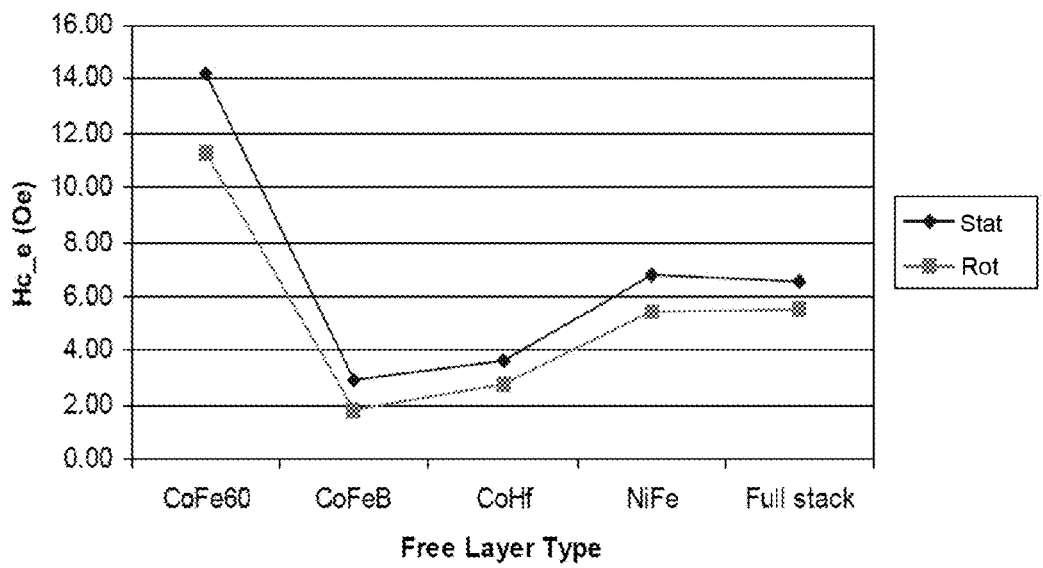
Figure 9C:
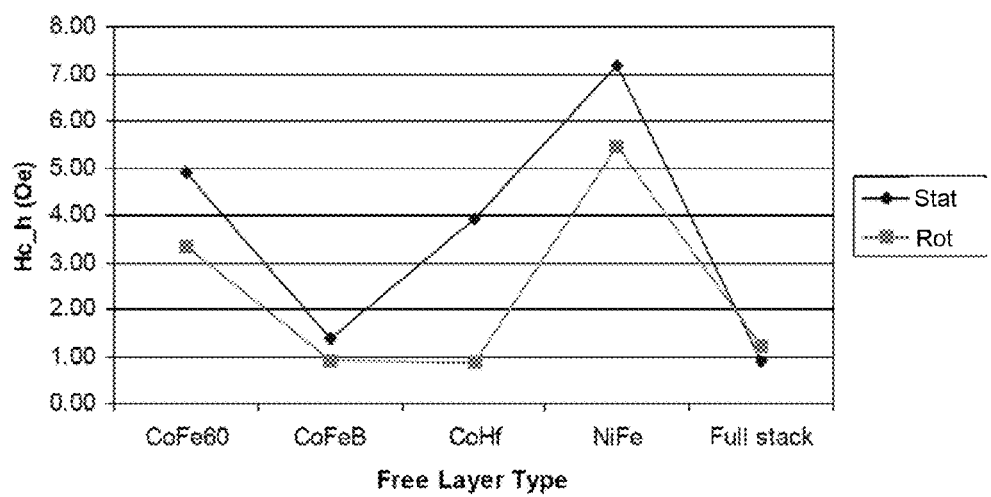

Moving to graphs 900, 910, 920 of FIGS. 9A-9C, after annealing in an applied field, e.g., to set the AFM perpendicular to the plane of deposition thereof, each of the ferromagnetic layers are shown as adopting an anisotropy field perpendicular to the plane of deposition as well. However, as shown in the graphs 900, 910, 920, the Hk values of the films deposited using static deposition Stat at an oblique angle as described above, are much larger than the Hk values of the films deposited using rotated deposition Rot.

Figure 10A:
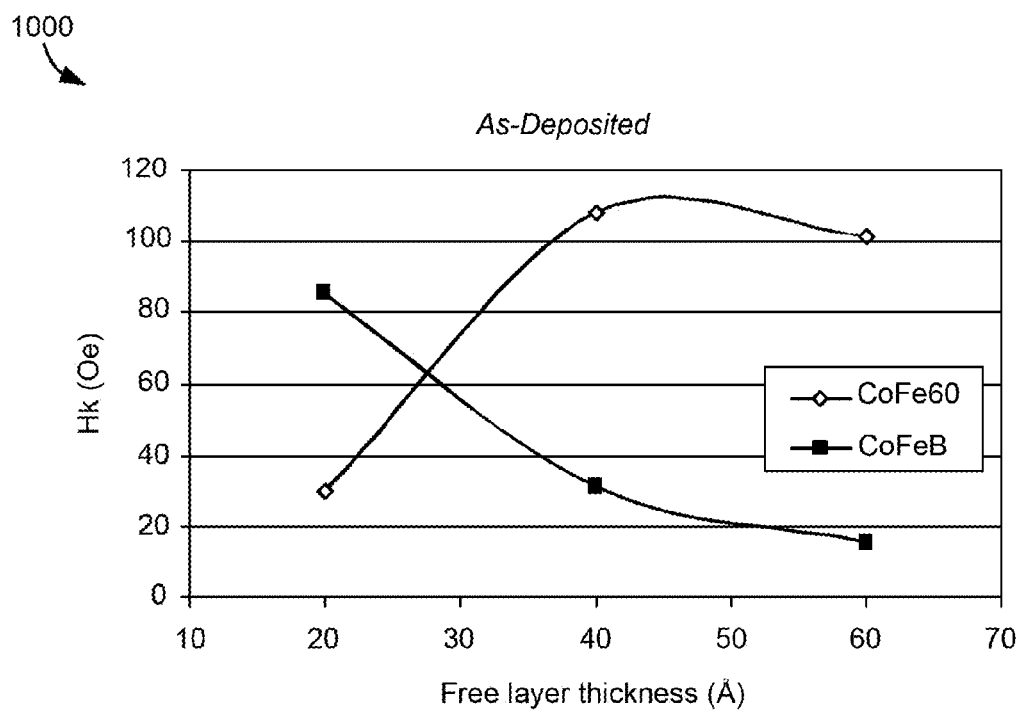
FIG. 10A is a graph illustrating the Hk values of two materials as-deposited, according to different embodiments.
Figure 10B:
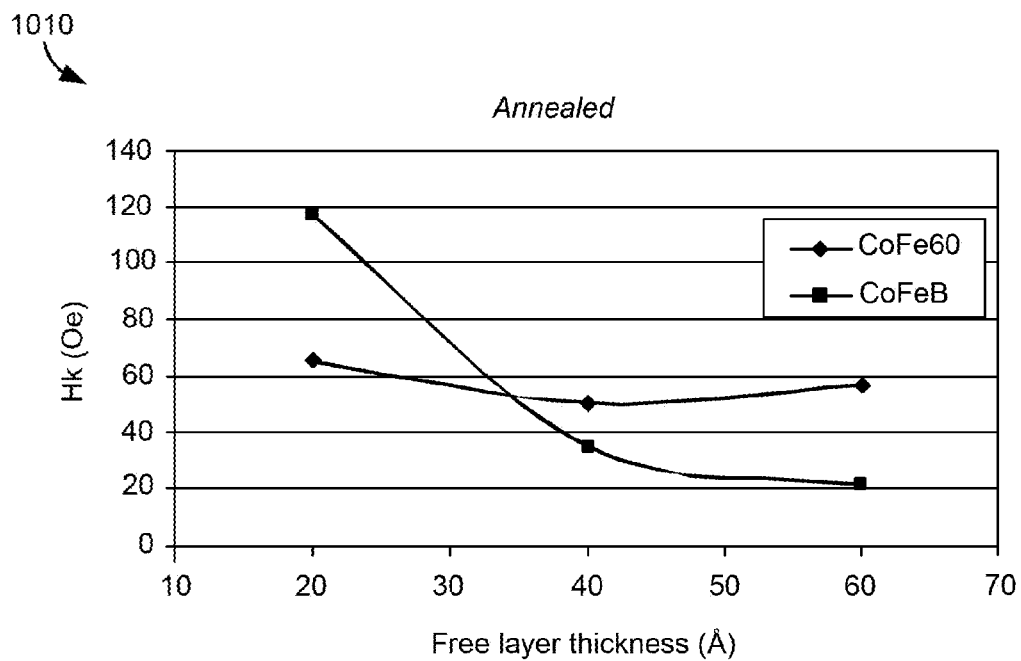
FIG. 10B is a graph illustrating the Hk values of two materials after being annealed, according to different embodiments.

FIGS. 10A-10B depict the dependence of film thickness on the anisotropy field induced by oblique angle deposition.

Moreover, the graphs 1000, 1010 illustrate the as-deposited and annealed Hk measurements as a function of film thickness for CoFe and CoFeB films.

As mentioned above, the symbols (points) on the curves of the graphs 1000, 1010 denote the orientation of the anisotropy for the given structure. The open symbols indicate instances in which the anisotropy is orientation in a direction perpendicular to the wafer alignment notch. Solid symbols indicate instances for which the orientation of the anisotropy is parallel to the wafer alignment notch.

Referring now to FIG. 10A, for the CoFe film, which exhibited parallel anisotropy in the as-deposited state, as the film thickness increased, so did the Hk values of the film. On the other hand, the CoFeB film, which developed perpendicular anisotropy under oblique angle deposition, exhibits Hk decreasing with increasing film thickness. Moreover, looking to FIG. 10B, after the films were annealed, the thinner CoFeB layers experienced the highest Hk values.

The inventors were surprised to achieve these results, as such results were unpredictable prior to conducting the experiments. The anisotropy orientation dependency on the material used in the layer in combination with the processing conditions were unknown prior to such experiments, and therefore one skilled in the art would not have been able to predict the outcome of such experiments prior to the present disclosure. Contrary to conventional wisdom, these results may indicate a bulk phenomenon for CoFe and an interfacial effect with respect to CoFeB, inducing the anisotropy under oblique angle deposition.

Figure 11A:
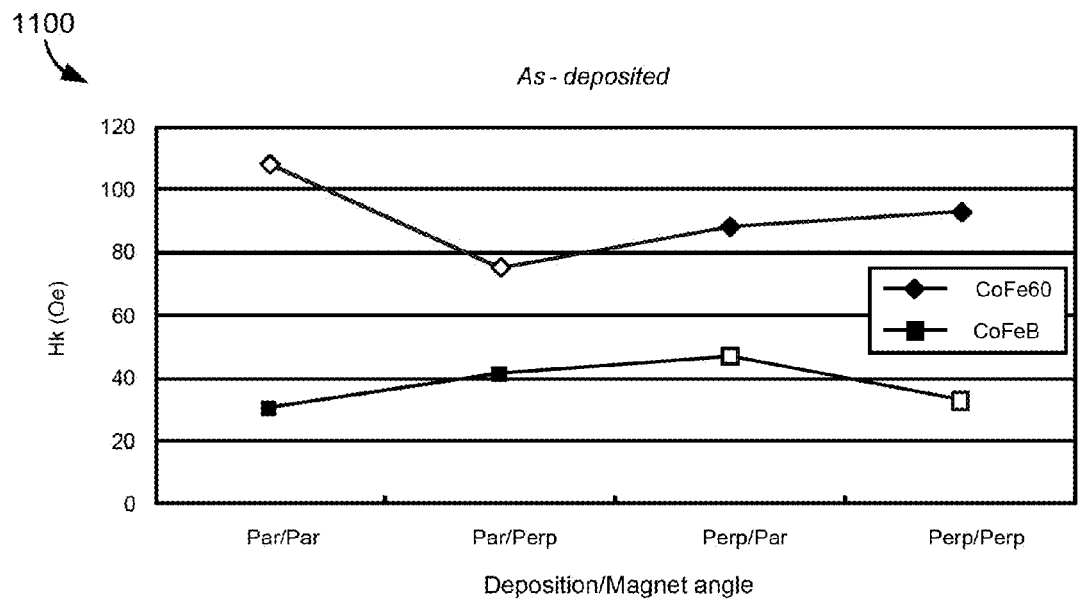
FIG. 11A is a graph illustrating the Hk values of two materials as-deposited, according to different embodiments.
Figure 11B:
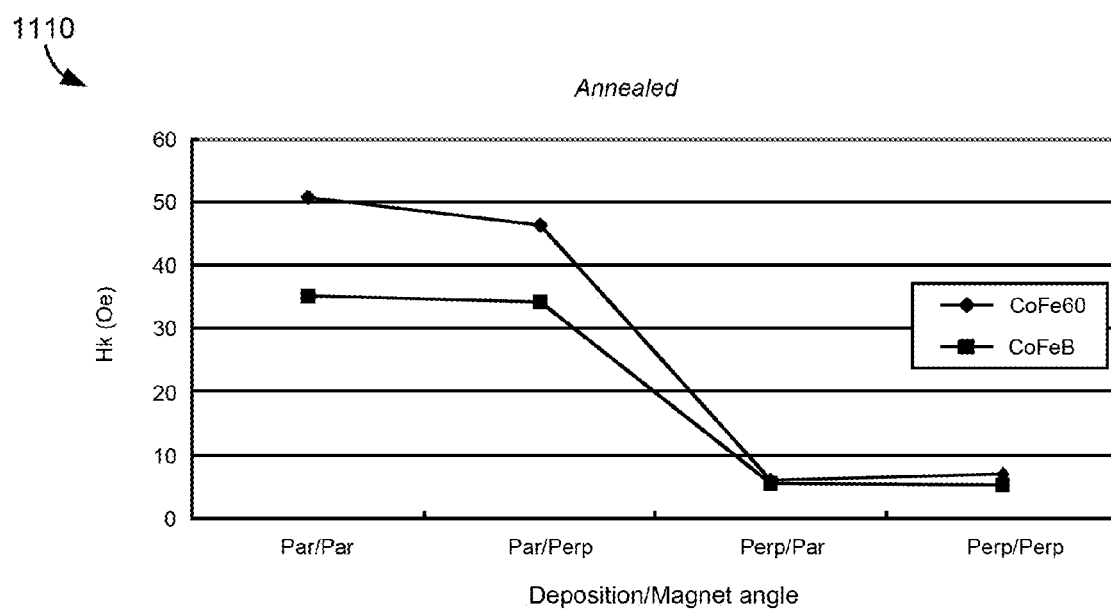
FIG. 11B is a graph illustrating the Hk values of two materials after being annealed, according to different embodiments.

Furthermore, FIG. 11A illustrates the effects of an external magnetic field during deposition of a given magnetic layer. Looking to the graph 1100, the anisotropy orientation is compared to the orientation of an external magnetic field. Furthermore, the graph 1110 of FIG. 11B shows the relationship of the two after annealing the magnetic layer in an applied magnetic field. It should be noted that for FIGS. 11A-11B, the parallel and perpendicular directions are with reference to the direction in which the annealing was applied (e.g., the magnetic orientation of a pinned layer).

Looking to FIG. 11A, in the "as-deposited" state, the direction of anisotropy was affected by the orientation of the static deposition angle relative to the orientation of an external magnetic field. Moreover, after annealing, only parallel angle anisotropy is preserved, as shown in FIG. 11B. However, as exemplified by both graphs 1100, 1110, the inventors found that the presence of a magnetic field during deposition of a magnetic layer did not seem to have a significant effect on the anisotropy magnitude and/or orientation for the magnetic layers after annealing.

To assess the film thickness uniformity using any of the deposition methods described above, magneto-optic Kerr effect (MOKE) magnetometry may be used. According to an exemplary embodiment, MOKE was used to measure the Kerr rotation angle at 49 points across sample wafers having 6 inch diameters and a full free layer stack (e.g., see FIG. 7) formed thereon. One of the samples tested was formed using rotational deposition, while the other sample was formed using static deposition.

The testing showed an increase in Hk from 26 Oe, for samples formed using rotational deposition, to 56 Oe for samples formed using static deposition of the full free layer stack. In addition, the uniformity of the anisotropy fields for the static deposition sample showed an improvement over the rotational deposition sample, as the standard deviation dropped from 9.0% for the rotational deposition, to 7.7% for static deposition. Thus, layers and/or sublayers formed using static deposition desirably provide reduced device-to-device variation.

As a result, the MOKE testing illustrated distinct advantages that the various embodiments described and/or suggested herein have over conventional products. Additionally, the results presented demonstrate the tunability of the magnetic layer anisotropy by choosing the correct static deposition angle depending on each material in the magnetic layer and/or sublayer stack.

Figure 12:
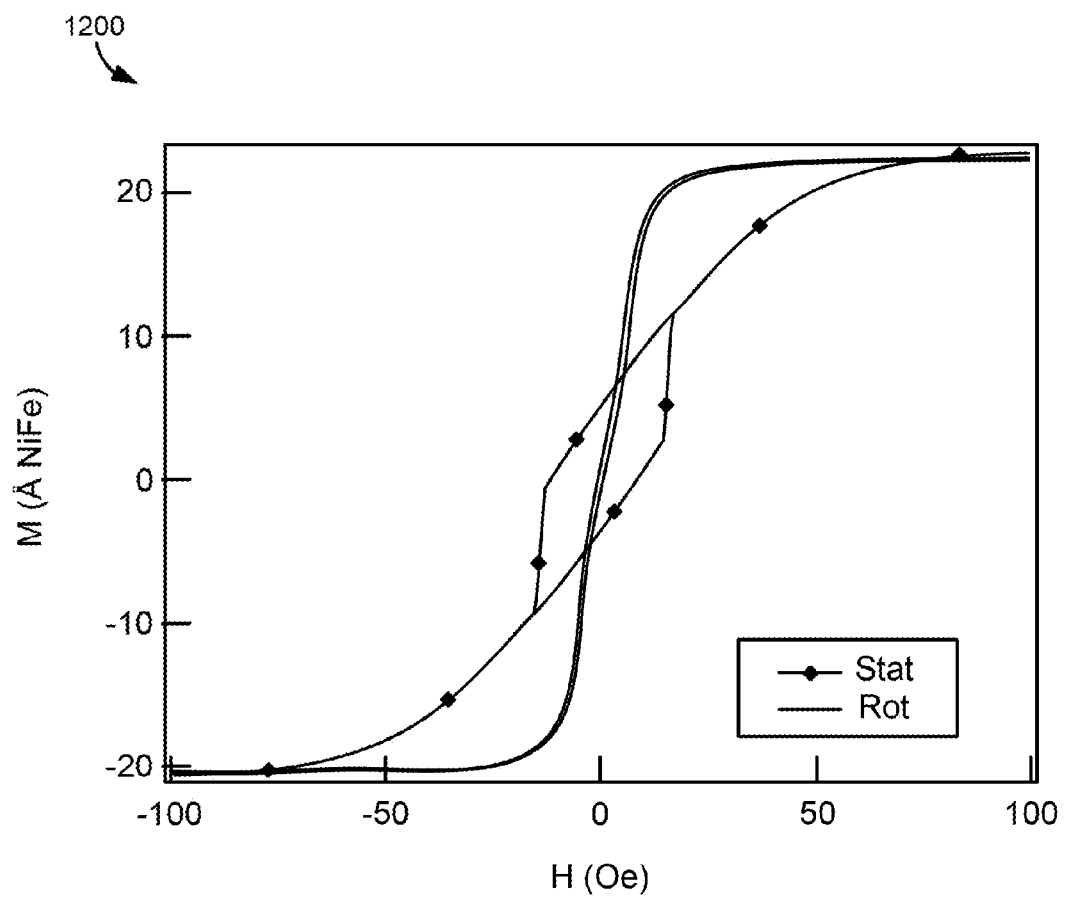
FIG. 12 is a graph illustrating comparative hysteresis loops of materials formed by conventional and inventive methods.

Moreover, it should also be noted that for certain elements, the inventors have found that the magnetic hysteresis loops appear to show a component of perpendicular anisotropy induced by the static oblique deposition. The properties of one such element are illustrated in the graph 1200 of FIG. 12, which plots the magnetization M v. the magnetic field H (e.g., a hysteresis loop) for a CoHf layer. It follows that, for some illustrative embodiments, such an induced perpendicular anisotropy may be beneficial for spin-torque MRAM devices with out-of-plane magnetization.

Figure 13:
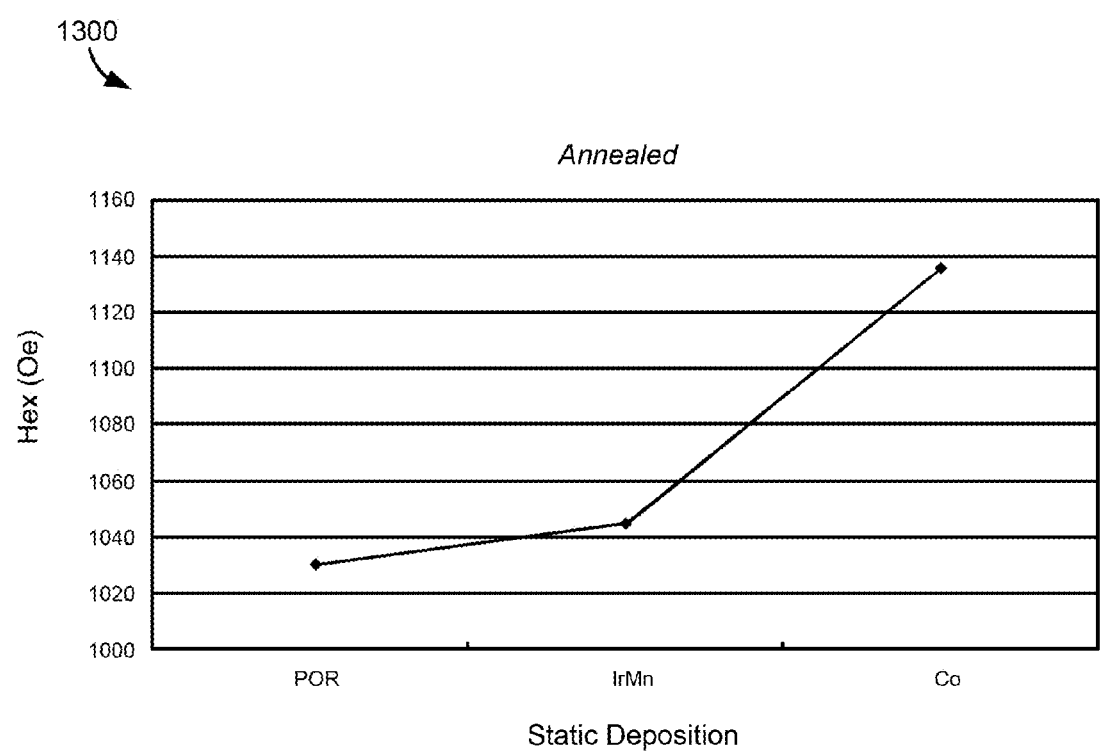
FIG. 13 is a graph illustrating the magnetic uniaxial exchange fields corresponding to different materials, according to different embodiments.

According to yet another embodiment, the inventors discovered that the exchange field, e.g., between magnetic layers, may be improved by incorporating static deposition techniques as described herein. The graph 1300 of FIG. 13 illustrates the pinning improvements experienced by forming a dual sublayer magnetic layer having a Co layered deposited on top of an IrMn layer using static deposition over rotational deposition (POR). As shown, a IrMn formed using static deposition at an oblique angle with Co conventionally deposited results in only a small increase in exchange pinning field, while a Co magnetic layer formed using static deposition on top of a conventionally deposited IrMn layer results in about a 10% improvement in exchange pinning field over the plan of record (POR) magnetic structure formed with rotational deposition for both materials.

It should be noted that methodology presented herein for at least some of the various embodiments may be implemented, in whole or in part, in computer hardware, software, by hand, using specialty equipment, etc. and combinations thereof.

Moreover, any of the structures and/or steps may be implemented using known materials and/or techniques, as would become apparent to one skilled in the art upon reading the present specification. According to the various approaches described and/or suggested herein, any of the aforementioned embodiments may be implemented with magnetic sensors of types known in the art, e.g., Tunnel Magnetoresistance (TMR) sensors, Giant Magnetoresistance (GMR) sensors, biological sensors, magnetoresistive random-access memory (MRAM), etc., depending on the desired embodiment.

It follows that, in addition to optimizing properties of magnetic layers in a sensor stack (e.g., a free layer), the various embodiments presented herein may be applied to the pinned ferromagnetic layers in spin valve devices as well, e.g., to improve pinning fields. In self-pinned devices and tri-layer sensors, which are not pinned by exchange coupling with an anti-ferromagnet, the enhancement of magnetic Hk by oblique angle deposition may provide increased self-pinning fields and resistance to amplitude flipping. Static deposition process steps can also be used to enhance the Hk of side shield, soft bias layers and S2 layers, comprised mainly of high-permeability, soft magnetic alloys such as NiFe, thereby preferably improving free layer stabilization.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
a magnetic layer of a magnetic head, the magnetic layer having first and second magnetic sublayers,
wherein an anisotropy of the first magnetic sublayer is oriented in a different direction than an anisotropy of the second magnetic sublayer,
wherein an interface between the magnetic sublayers is oriented at an angle of greater than 2 degrees and less than 88 degrees relative to a plane of deposition thereof,
wherein the magnetic layer is at least one of a pinned layer, a soft bias layer, and a shield layer.

2. The system as recited in claim 1, wherein the magnetic layer is a pinned layer of the magnetic head.

3. The system as recited in claim 1, wherein the magnetic layer is a soft bias layer of the magnetic head.

4. The system as recited in claim 1, wherein the magnetic layer is a shield layer of the magnetic head.

5. The system as recited in claim 1, further comprising a second magnetic layer spaced from the magnetic layer, the second magnetic layer having third and fourth magnetic sublayers, wherein an anisotropy of the third magnetic sublayer is oriented in a different direction than an anisotropy of the fourth magnetic sublayer.

6. A magnetic data storage system, comprising:
at least one magnetic head having the magnetic layer as recited in claim 1;
a magnetic medium;
a drive mechanism for passing the magnetic medium over the at least one magnetic head; and
a controller electrically coupled to the at least one magnetic head for controlling operation of the at least one magnetic head.

7. The system as recited in claim 1, wherein a deposition thickness of the magnetic layer is less than 60 angstroms, wherein the magnetic layer includes at least one material selected from a group consisting of Co, Fe, Ni, CoFe, CoFeB, CoHf and NiFe.

8. The system as recited in claim 1, wherein the magnetic layer includes at least one material selected from a group consisting of Co, Fe, Ni, CoFe, CoFeB, CoHf and NiFe.

9. The system as recited in claim 1, wherein a deposition thickness of the magnetic layer is less than 60 angstroms.

10. A system, comprising:
a magnetic layer of a magnetic head, the magnetic layer having first and second magnetic sublayers,
wherein an anisotropy of the first magnetic sublayer is oriented in a different direction than an anisotropy of the second magnetic sublayer,
wherein an interface between the magnetic sublayers is oriented at an angle of greater than 2 degrees and less than 88 degrees relative to a plane of deposition thereof,
wherein the magnetic layer is a free layer of a magnetic head.

11. The system as recited in claim 10, wherein a magnitude of the anisotropy of the first magnetic sublayer is different than a magnitude of the anisotropy of the second magnetic sublayer.

12. The system as recited in claim 10, wherein a deposition thickness of the free layer is less than 60 angstroms.

13. The system as recited in claim 10, wherein the magnetic layer includes at least one material selected from a group consisting of Co, Fe, Ni, CoFe, CoFeB, CoHf and NiFe.

14. The system as recited in claim 10, wherein the magnetic layer has a higher strain along a first axis than along a second axis oriented perpendicular to the first axis and in a same plane therewith.

15. The system as recited in claim 10, wherein the two magnetic sublayers are in direct contact with each other.

16. A magnetic head, comprising:
a magnetic layer having first and second magnetic sublayers directly adjacent one another,
wherein a deposition thickness of the magnetic layer is less than 60 angstroms,
wherein an interface between the magnetic sublayers is oriented at an angle of greater than 2 degrees and less than 88 degrees relative to a plane of deposition thereof,
wherein the magnetic layer includes at least one material selected from a group consisting of Co, Fe, Ni, CoFe, CoFeB, CoHf and NiFe.

17. The magnetic head as recited in claim 16, wherein an anisotropy of the first magnetic sublayer is oriented in a different direction than an anisotropy of the second magnetic sublayer.

18. The magnetic head as recited in claim 16, wherein a magnitude of the anisotropy of the first magnetic sublayer is different than a magnitude of the anisotropy of the second magnetic sublayer.

19. The magnetic head as recited in claim 16, wherein the magnetic layer has a higher strain along a first axis than along a second axis oriented perpendicular to the first axis and in a same plan therewith.

20. A magnetic data storage system, comprising:
at least one magnetic head as recited in claim 16;
a magnetic medium;
a drive mechanism for passing the magnetic medium over the at least one magnetic head; and
a controller electrically coupled to the at least one magnetic head for controlling operation of the at least one magnetic head.

21. The magnetic head as recited in claim 16, wherein the magnetic layer is a free layer of a magnetic head having a media facing surface.

22. The magnetic head as recited in claim 21, further comprising a second magnetic layer spaced from the magnetic layer, the second magnetic layer having third and fourth magnetic sublayers, wherein an anisotropy of the third magnetic sublayer is oriented in a different direction than an anisotropy of the fourth magnetic sublayer, wherein the media facing surface is an air bearing surface.

23. A magnetic head, comprising:
a magnetic layer having first and second magnetic sublayers directly adjacent one another,
wherein a deposition thickness of the magnetic layer is less than 60 angstroms,
wherein an interface between the magnetic sublayers is oriented at an angle of greater than 2 degrees and less than 88 degrees relative to a plane of deposition thereof,
wherein the magnetic layer includes at least one material selected from a group consisting of Co, Fe, Ni, CoFe, CoFeB, CoHf and NiFe,
wherein the magnetic layer is at least one of a pinned layer, a soft bias layer, and a shield layer.

* * * * *